US012567858B2

(12) United States Patent
Li

(10) Patent No.: US 12,567,858 B2
(45) Date of Patent: Mar. 3, 2026

(54) HIGH-SPEED DELAY LINE FOR DIE-TO-DIE INTERCONNECT

(71) Applicant: Taiwan Semiconductor Manufacturing Company, Ltd., Hsinchu (TW)

(72) Inventor: Shenggao Li, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 43 days.

(21) Appl. No.: 18/239,839

(22) Filed: Aug. 30, 2023

(65) Prior Publication Data

US 2024/0305285 A1 Sep. 12, 2024

Related U.S. Application Data

(60) Provisional application No. 63/488,540, filed on Mar. 6, 2023.

(51) Int. Cl.
H03K 5/134 (2014.01)
H03K 3/03 (2006.01)
(Continued)

(52) U.S. Cl.
CPC ........... H03K 5/134 (2014.07); H03K 3/0315 (2013.01); H03K 19/018521 (2013.01); H03K 2005/00202 (2013.01)

(58) Field of Classification Search
CPC ................. H03K 5/134; H03K 3/0315; H03K 19/018521; H03K 2005/00202;
(Continued)

(56) References Cited

U.S. PATENT DOCUMENTS

| | | | |
|---|---|---|---|
| 7,012,956 B1 | 3/2006 | Thomsen et al. | |
| 2007/0236269 A1 | 10/2007 | Viswanathan | |

(Continued)

FOREIGN PATENT DOCUMENTS

| | | | | |
|---|---|---|---|---|
| KR | 20080086008 A | 9/2008 | | |
| KR | 100868944 B1 * | 11/2008 | ........... | H03L 7/0995 |

(Continued)

OTHER PUBLICATIONS

Taiwan office action; Application No. 112139293; Dated Mar. 6, 2025.

(Continued)

*Primary Examiner* — Lincoln D Donovan
*Assistant Examiner* — Amit R Bhatia
(74) *Attorney, Agent, or Firm* — Jones Day

(57) ABSTRACT

Systems and methods are provided for a delay line circuit that comprises a delay line core and a first current mirror circuit. The delay line core includes a plurality of inverters connected in series. Each of the plurality of inverters is coupled to a first common node. The first current mirror circuit includes a first current source configured to generate a first digital-to-analog (DAC) current, a first transistor coupled to the first current source, and a plurality of first controlling transistors coupled to the first transistor and the first common node. The plurality of first controlling transistors generates a first mirror current at the first common node based on the first DAC current. A delay time of the delay line core is controlled based on the first mirror current.

20 Claims, 12 Drawing Sheets

(51) Int. Cl.
　　*H03K 5/00*　　　　(2006.01)
　　*H03K 19/0185*　　　(2006.01)
(58) Field of Classification Search
　　CPC ..................... H03K 5/133; H03K 5/14; H03K
　　　　　　　　　　2005/00065; H03K 7/08; H03K 9/08
　　See application file for complete search history.

(56)　　　　　　　References Cited

U.S. PATENT DOCUMENTS

| | | |
|---|---|---|
| 2010/0079180 A1 | 4/2010 | Kim et al. |
| 2012/0223780 A1 | 9/2012 | Urakawa |
| 2013/0342256 A1 | 12/2013 | Wadhwa et al. |
| 2016/0065193 A1 | 3/2016 | Faue et al. |
| 2024/0146313 A1* | 5/2024 | Meruva .................. H03K 5/131 |

FOREIGN PATENT DOCUMENTS

| | | |
|---|---|---|
| KR | 20100037427 A | 4/2010 |
| TW | 200835137 A | 8/2008 |

OTHER PUBLICATIONS

Korean office action; Application No. 10-2024-0031367; Dated Jun. 19, 2025.
Taiwan Office Action; Application No. 112139293; Dated Aug. 6, 2024.
Korean office action; Application No. 10-2024-0031367; Dated Jan. 12, 2026.

* cited by examiner

HIGH-SPEED DELAY LINE FOR DIE-TO-DIE INTERCONNECT

CROSS-REFERENCE TO RELATED APPLICATIONS

This application claims priority to U.S. Provisional Patent Application No. 63/488,540, filed Mar. 6, 2023, entitled "High-Speed Delay Line," which is incorporated herein by reference in its entirety.

FIELD

The present disclosure relates to delay lines.

BACKGROUND

A delay line is an electrical component that can delay an analog signal with respect to time. Several drawbacks are associated with some delay lines. For example, delay lines may include various electrical components such as delay buffers and delay control current or capacitor arrays. These electrical components can cause parasitic resistance and capacitance on the signal path. That parasitic resistance and capacitance can decrease the maximum speed at which the analog signal can travel along the delay line and can decrease the delay coverage range of the delay line.

BRIEF DESCRIPTION OF THE DRAWINGS

The following detailed description will be better understood when read in conjunction with the appended drawings. For the purpose of illustration, there are shown in the drawings certain embodiments of the present disclosure. It should be understood, however, that the invention is not limited to the precise arrangements and instrumentalities shown. The accompanying drawings, which are incorporated in and constitute a part of this specification, illustrate an implementation of systems and apparatuses consistent with the present invention and, together with the description, serve to explain advantages and principles consistent with the invention.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

It is to be understood that the phraseology and terminology employed herein are for the purpose of description and should not be regarded as limiting. For example, the use of a singular term, such as, "a" is not intended as limiting of the number of items. Also the use of relational terms, such as but not limited to, "top," "bottom," "left," "right," "upper," "lower," "down," "up," "side," are used in the description for clarity and are not intended to limit the scope of the invention or the appended claims. Further, it should be understood that any one of the features can be used separately or in combination with other features. Other systems, methods, features, and advantages of the invention will be or become apparent to one with skill in the art upon examination of the detailed description. It is intended that all such additional systems, methods, features, and advantages be included within this description, be within the scope of the present invention, and be protected by the accompanying claims.

A delay line is an electrical component that can delay an analog signal with respect to time. Delay lines typically include a signal path (e.g., core) through which the delayed signal passes. In delay lines, components within the signal path may include parasitic resistance and parasitic capacitance. This parasitic resistance and capacitance can consume an undesirable amount of power. Furthermore, conventional delay lines may be unable to meet speed and delay range requirements due to the parasitic resistance and capacitance.

In embodiments, it may be desirable for a delay line to eliminate components from the signal path of the delay line. Furthermore, it may be desirable to mitigate the parasitic resistance and capacitance within the signal path. Embodiments disclosed herein involve controlling the delay and duty cycle of a delay line through current mirrors external from the signal path. Current mirrors can operate at a low frequency (e.g., 100 MHz), which can consume less power. Furthermore, the current mirrors external from the signal path of the delay line can mitigate parasitic resistance and capacitance within the signal path, resulting in more efficient power usage and increased frequencies of the delay line signal path.

Figure 1A:
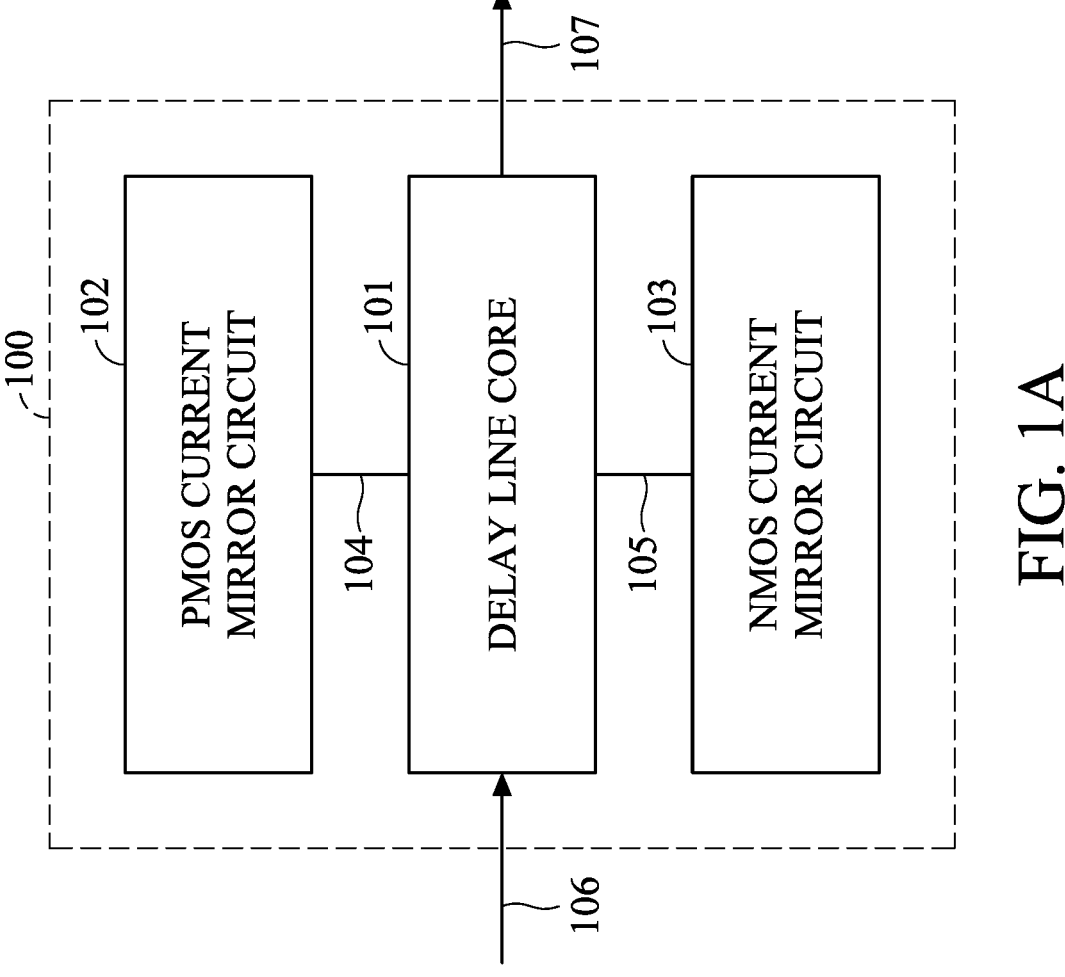
FIG. 1A depicts a high-speed delay line, in accordance with some embodiments.

FIG. 1A depicts a high-speed delay line, in accordance with some embodiments. In the example depicted in FIG. 1A, the high-speed delay line 100 includes a delay line core 101. The high-speed delay line 100 further includes a PMOS current mirror circuit 102 and an NMOS current mirror circuit 103. The PMOS current mirror circuit 102 is coupled to the delay line core 101 at a first common node 104. The NMOS current mirror circuit 103 is coupled to the delay line core 101 at a second common node 105. The delay line core 101 receives a delay line input signal 106. The PMOS current mirror circuit 102 and the NMOS current mirror circuit 103 can control the delay line core 101 or components of the delay line core 101 to delay or invert the received delay line input signal 106. Based on the control of the PMOS current mirror circuit 102 and the NMOS current mirror circuit 103, the delay line core 101 generates a delay line output signal 107 having a specific delay and duty cycle.

Figure 1B:
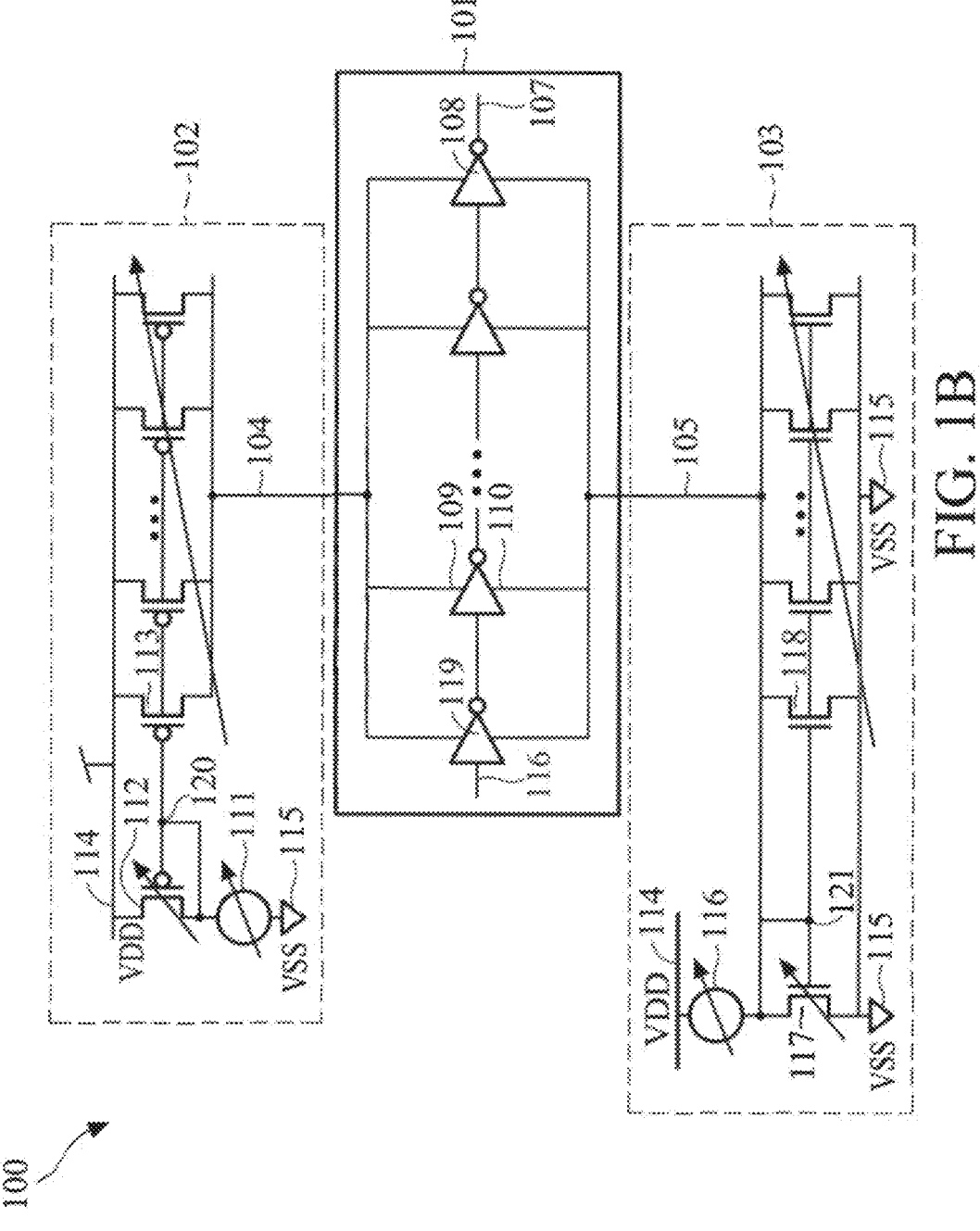
FIG. 1B depicts a detailed high-speed delay line, in accordance with some embodiments.

FIG. 1B depicts a detailed high-speed delay line, in accordance with some embodiments. In the example embodiment depicted in FIG. 1B, the delay line core 101 includes a plurality of inverters 108 coupled to one another in series. Each of the plurality of inverters 108 includes a first controlling node 109 and a second controlling node 110. The first common node 104 is coupled to each of the plurality of inverters 108 at the first controlling node 109 and the second common node 105 is coupled to each of the plurality of inverters 108 at the second controlling node 110. The PMOS current mirror circuit 102 includes a plurality of p-channel controlling transistors 113 coupled in parallel with one another. In the example embodiment depicted in FIG. 1B, the plurality of p-channel transistors 113 are p-channel metal-oxide semiconductor (PMOS) field-effect transistors, but in some examples other transistors may be used.

The PMOS current mirror circuit 102 further includes a first current digital-to-analog converter (DAC) 111 coupled to a first PMOS transistor 112. For example, the first current DAC 111 may include a first end coupled to a supply voltage node VSS 115. In some examples, the supply voltage node VSS 115 represents electrical ground. The first current DAC 111 may further include a second end coupled to a drain terminal of the first PMOS transistor 112. The second end of the first current DAC 111 is further coupled to a gate terminal of the plurality of PMOS controlling transistors 113. The first current DAC 111 is configured to generate a programmable output current from a reference current or a reference voltage controlled by digital control signals (not shown) using switched current mirrors or resistors. Accordingly, the first current DAC 111 can control the current output at the second node end. A source terminal of each of the plurality of PMOS controlling transistors 113 is coupled to an operating voltage node VDD 114. The operating voltage node VDD 114 represents an operating voltage of the electronic device in which the high-speed delay line 100 is implemented.

The example high-speed delay line 100 further includes the NMOS current mirror circuit 103, which is coupled to the second common node 105 of the delay line core 101. The NMOS current mirror circuit 103 includes a plurality of n-channel controlling transistors 118 coupled in parallel with one another. In the example embodiment depicted in FIG. 1B, the plurality of n-channel controlling transistors 118 are n-channel metal-oxide semiconductor (NMOS) field-effect transistors, but in some examples other transistors may be used.

The NMOS current mirror circuit further includes a second current digital-to-analog converter (DAC) 116 coupled to a first NMOS transistor 117. For example, the second current DAC 116 may include a first end coupled to the operating voltage node VDD 114. The second current DAC 116 further includes a second end coupled to a drain terminal of the first NMOS transistor 117. The second end of the second current DAC 116 is further coupled to a gate terminal of the plurality of NMOS controlling transistors 118. The second current DAC 116 may be configured to convert an NMOS current signal comprising a digital representation of a quantity (e.g., a digital code) into a current output at the second end of the second current DAC 116. The current output may have a discrete analog value. The operation of the second current DAC 116 may be substantially similar to the first current DAC 111, as described above. Accordingly, the second current DAC 116 can control the analog value of the current output at the second end. A source terminal of each of the plurality of NMOS controlling transistors 118 is coupled to the supply voltage node VSS 115.

The high-speed delay line 100 can be used to strategically delay the time required for the delay line input signal 106 to travel from a first end of the delay line core 101 to a second end of the delay line core 101. For example, the delay line input signal 106 is received at a first inverter 119 of the delay line core 101. The first inverter 119 produces an inverted signal at its output. The time between the first inverter's reception of the delay line input signal 106 and its output of the inverted signal is dependent upon the voltages present at the first controlling node 109 and the second controlling node 110 of the first inverter 119. Generally, inverters contain an inverse relationship between the received controlling voltage (e.g., the voltages present at the first controlling node 109 and the second controlling node 110) and the time delay of the inverter. Thus, a higher voltage at the first common node 104 or the second common node 105 will be received as a controlling voltage to the first inverter 119 at the first or second controlling nodes 109,110, respectively. This will result in a lower delay time between the reception of the delay line input signal 106 and the output of the inverted signal. Furthermore, a lower voltage at the first common node 104 or the second common node 105 will be received as a controlling voltage to the first inverter 119 and will result in a higher delay time between the reception of the delay line input signal 106 and the output of the inverted signal. As discussed above, the first common node 104 and the second common node 105 are coupled to each of the plurality of inverters 108 within the delay line core. Thus, the time required for a signal to pass through the delay line core 101 (e.g., each of the plurality of inverters) can be altered by controlling the voltages present at the first common node 104 and the second common node 105.

In some example embodiments, the delay line core 101 includes an even number (e.g., 8 or 16) of inverters 108. In examples in which an even number of inverters 108 are employed in the delay line core 101, the delay line input signal 106 is inverted an even number of times, and the value of the delay line output signal 107 is substantially the same as the value of the delay line input signal 106. In these examples, the time required for the delay line input signal 106 to pass through the delay line core 101 may be the sum of the delay time required for the signal to pass through each individual inverter 108. The delay line core 101 with an even number of inverters 108 can thus be used to implement a single delay period following the reception of the delay line input signal 106 at the delay line core 101, with signals at each of the delay stages equally spaced within a clock cycle to produce multi-phase clocks in a delay locked loop.

In some example embodiments, the delay line core 101 includes an odd number of inverters 108. In these examples, the delay line input signal 106 is inverted by the delay line core 101 an odd number of times, and the delay line output signal 107 is inverted with respect to the delay line output signal 107. Furthermore, the output of the delay line core 101 (e.g., the output of the last inverter of the delay line core 101) may be coupled to the input of the delay line core 101 (e.g., the input to the first inverter of the delay line core 101) through a feedback path (not shown). Thus, the value of the delay line input signal 106 at the input of the delay line core 101 may continually oscillate between the original value of the signal and an inverted value of the signal. The frequency and period of the delay line output signal 107 with respect to time are dependent upon the delay times of each of the plurality of inverters 108 within the delay line core 101. Therefore, the frequency and period of the delay line output signal 107 with respect to time may be modified by changing the value of the voltage levels present at the first common node 104 and the second common node 105.

The PMOS current mirror circuit 102 may be used to both coarse-tune and to fine-tune the delay time of the delay line core 101. For example, the first current DAC 111 produces a first DAC current from the drain terminal of the first PMOS transistor 112 to the supply voltage node VSS. In a MOSFET current mirror, the output current of the mirror is substantially identical to the input current if the mirror has a 1:1 mirror ratio. Therefore, substantially all of the first DAC current flows from the operating voltage node VDD 114 to the first PMOS transistor's 112 drain terminal. In the example shown in FIG. 1B, the characteristics of the first PMOS transistors and of each of the plurality of PMOS controlling transistors are substantially identical (or a predefined ratio determined by the mirror ratio). Therefore, a current substantially identical (or at a predefined ratio) to the first DAC current is reproduced (e.g., mirrored) at each of the plurality of PMOS controlling transistors 113 that is coupled at its gate terminal to the PMOS gate terminal node 120. Due to the high accuracy of MOSFET current mirrors, multiple PMOS controlling transistors 113 can be coupled to the PMOS gate terminal node 120 with negligible effect on the current generated at their drain terminal.

The sum of each of the currents generated by the plurality of PMOS controlling transistors 113 is received at the first common node 104 as a PMOS mirror current. Therefore, a greater number of PMOS controlling transistors 113 coupled to the PMOS gate terminal node 120 will result in a higher PMOS mirror current at the first common node 104. The PMOS mirror current passes through the first common node 104 and generates a first controlling voltage. A greater PMOS mirror current will result in a greater voltage drop at the first common node 104, and thus a lower voltage at the first controlling node 109 of each inverter. Therefore, a greater number of PMOS controlling transistors 113 coupled to the PMOS gate terminal node 120 will result in a higher PMOS mirror current, and thus a lower voltage at the first controlling nodes 109.

The PMOS current mirror circuit 102 may be designed to be programmable, and coupled to a control module (not shown). The control module can generate a PMOS coarse-tuning signal, which can be received by the PMOS current mirror circuit 102. For example, the coarse-tuning signal may be in the form of a digital code. The PMOS current mirror circuit 102 can connect and disconnect the gate terminals of the PMOS controlling transistors 113 from the PMOS gate terminal node 120 based on the received PMOS coarse-tuning signal. Therefore, the PMOS current mirror circuit 102 can use the PMOS coarse-tuning signal to strategically connect and disconnect the PMOS controlling transistors 113 from the PMOS gate terminal node 120. The number of PMOS controlling transistors 113 connected in parallel can thus change the voltage level at the first common node 104, and in turn modify the delay time through each of the plurality of inverters 119 within the delay line core 101.

Furthermore, the first current DAC 111 can be used to fine-tune the delay time of the delay line core 101. For example, the first current DAC 111 may receive a PMOS fine-tuning signal. For example, the PMOS fine-tuning signal may be generated in the control module and thereafter received by the first current DAC 111. Based on the PMOS fine-tuning signal, the first current DAC adjusts the first DAC current by a continuous amount. Based on the first DAC current, the current across each of the plurality of PMOS controlling transistors 113 connected to the PMOS gate terminal node 120 can be adjusted, which can modify the voltage level at the first common node 104. For example, an increased first DAC current results in an increased substantially equivalent current distributed across each of the plurality of PMOS controlling transistors 113 within the PMOS current mirror circuit 102. As discussed above, this increases the total PMOS mirror current, which increases the voltage at the first controlling node 109 of each inverter 108. The increased voltage at the first controlling nodes 109 can be used to control the delay time of each of the plurality of inverters 108 within the delay line core 101.

In addition, the NMOS current mirror circuit 103 may be used to both coarse-tune and to fine-tune the delay time of the delay line core 101. For example, the second current DAC 116 produces a second DAC current from the operating voltage node VDD 114 to the drain terminal of the first NMOS transistor 117. As discussed above, MOSFET current mirrors have a high mirroring accuracy if the current mirror ratio is 1:1. In the example shown in FIG. 1B, the characteristics of the first NMOS transistor 117 and of each of the plurality of NMOS controlling transistors 118 are substantially identical. Therefore, a current substantially identical to the second DAC current is reproduced (e.g., mirrored) at each of the plurality of NMOS controlling transistors 118 that is coupled at its gate terminal to the NMOS gate terminal node 121. This substantially identical current flows from the second common node 105 to the drain terminal of each NMOS controlling transistor 118 coupled to the NMOS gate terminal node 121. Due to the high accuracy of MOSFET current mirrors, multiple NMOS controlling transistors 118 can be coupled to the NMOS gate terminal node 121 with negligible effect on the current generated at their drain terminal.

The sum of the currents generated by the plurality of NMOS controlling transistors 118 is generated from the second common node 105 as an NMOS mirror current. Therefore, a greater number of NMOS controlling transistors 118 coupled to the NMOS gate terminal node 121 will result in a higher NMOS mirror current at the second common node 105. The NMOS mirror current passes through the second common node 105 and generates a second controlling voltage. A greater NMOS mirror current will result in a higher voltage at the second controlling node 110 of each inverter. The voltage at the second controlling node 110 of each inverter 108 can be controlled by modifying the number of NMOS controlling transistors 118 coupled to the NMOS gate terminal node 121. For example, a higher number of NMOS controlling transistors 118 coupled to the NMOS gate terminal node 121 will result in a higher NMOS mirror current, and thus a lower voltage at the second controlling nodes 110.

The NMOS current mirror circuit 103 may be coupled to the control module (not shown). The control module can generate an NMOS coarse-tuning signal, which can be received by the NMOS current mirror circuit 103. For example, the course-tuning signal may be in the form of a digital code. The NMOS current mirror circuit 103 can connect and disconnect the gate terminals of the NMOS controlling transistors 118 from the NMOS gate terminal node 121 based on the received NMOS coarse-tuning signal. The number of NMOS controlling transistors 118 connected in parallel can thus change the voltage level at the second common node 105, and in turn modify the delay time through each of the plurality of inverters 108 within the delay line core 101 by discrete time increments.

Furthermore, the second current DAC 116 can be used to fine-tune the delay time of the delay line core 101. For example, the second current DAC 116 may receive an NMOS fine-tuning signal. Based on the NMOS fine-tuning signal, the second current DAC 116 adjusts the second DAC current by a discrete amount. Based on the second DAC current, the current across each of the plurality of NMOS controlling transistors 118 connected to the NMOS gate terminal node 121 can be adjusted, which can modify the voltage level at the second common node 105. For example, an increased second DAC current may result in an increased substantially equivalent current distributed across each of the plurality of NMOS controlling transistors 118 within the NMOS current mirror circuit 103. This can reduce the voltage at the second controlling node 110 of each inverter 108. The reduced voltage at the second controlling nodes 110 can be used to control the delay time of each of the plurality of inverters 108 within the delay line core 101.

As an example, the delay time for the delay line input signal 106 to travel through the delay line core 101 may be too long for a given application. Based on a determination that the delay time of the delay line core 101 is too long, the control module may produce a PMOS coarse-tuning signal indicating that the delay time of the delay line core 101 should be reduced. The PMOS current mirror circuit 102 receives this PMOS coarse-tuning signal. Based on the PMOS coarse-tuning signal, the PMOS current mirror circuit 102 can connect the gate terminal of one or more PMOS controlling transistors 113 to the PMOS gate terminal node 120. Therefore, a smaller PMOS mirror current flows through the first common node 104, and a smaller voltage drop occurs across the PMOS controlling transistor's 113 drain and source terminals. Thus, a higher first controlling voltage is present at the first controlling node 109 of each inverter 108.

The higher first controlling voltage can result in a shorter delay time of each inverter 108 and thus a shorter total delay time of the delay line core 101. Similarly, the control module may produce an NMOS coarse-tuning signal indicating that the delay time of the delay line core 101 should be decreased. The NMOS coarse-tuning signal can generate a lower second controlling voltage is at the second controlling node 110 of each inverter 108, which can result in a shorter delay time of each inverter 108 and thus a shorter total delay time of the delay line core 101. The current within the PMOS controlling transistors 113 and the NMOS controlling transistors 118 are typically controlled in tandem for delay or frequency control.

Furthermore, the first current DAC 111 and the second current DAC 116 can be used to fine-tune the delay of the delay line core 101. In an example in which the delay of the delay line core 101 is too long, the control module generates a PMOS fine-tuning signal indicating that the delay of the delay line core 101 should be reduced. The PMOS fine-tuning signal is received by the first current DAC 111. Based on the PMOS fine-tuning signal, the first current DAC 111 increases the first DAC current. This increases the PMOS mirror current causing inverters in the delay line core 101 to be charged to a high-voltage rail faster, which increases the average voltage at the first controlling node 109 of each inverter 108. As discussed, this reduces the delay of each of the inverters 108 and the total delay of the delay line core 101. Similarly, the control module generates an NMOS fine-tuning signal indicating that the delay of the delay line core 101 should be reduced, which causes the inverters in the delay line core 101 to be discharged to a low-voltage rail faster, and decreases the average voltage at the second controlling node 110 of each inverter 108. As discussed, this reduces the delay of each of the inverters 108 and the total delay of the delay line core 101.

Figure 2:
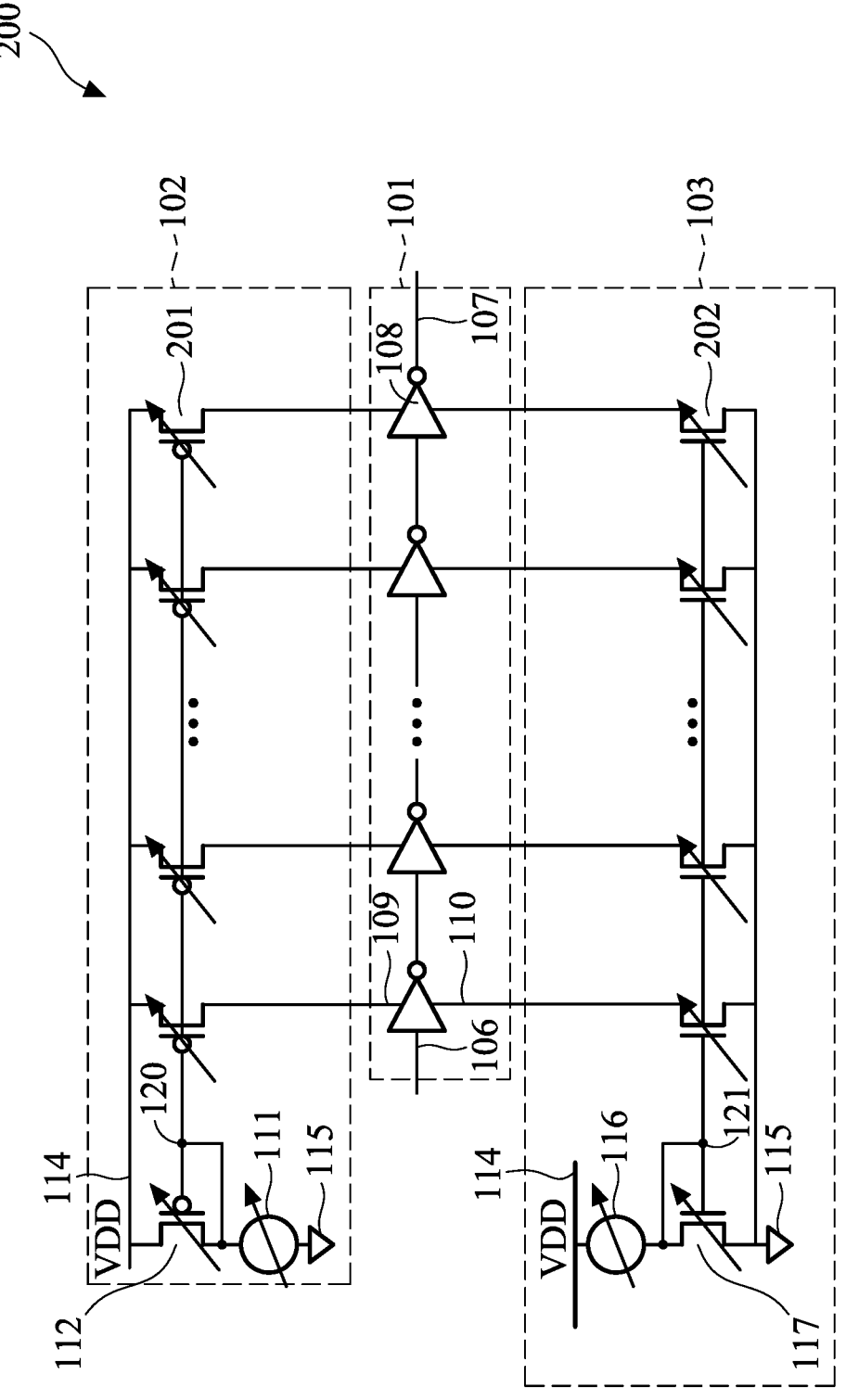
FIG. 2 depicts a high-speed delay line with individually controlled inverters, in accordance with some embodiments.

FIG. 2 depicts a high-speed delay line 200 with individually controlled inverters, in accordance with some embodiments. In the example embodiment depicted in FIG. 2, the example high-speed delay line 200 with individually controlled inverters includes a delay line core 101, a PMOS current mirror circuit 102, and an NMOS current mirror circuit 103. As shown in FIG. 2, the first controlling node 109 of each of the plurality of inverters 108 within the delay line core 101 is coupled to a separate PMOS controlling transistor 201 within the PMOS current mirror circuit 102. Furthermore, the second controlling node 110 of each of the plurality of inverters 108 within the delay line core 101 is coupled to a separate NMOS controlling transistor 202 within the NMOS current mirror circuit 103. An example architecture of each PMOS controlling transistor 201 and each NMOS controlling transistor 202 can be best understood when considered in conjunction with FIGS. 3A and 3B.

Figure 3A:
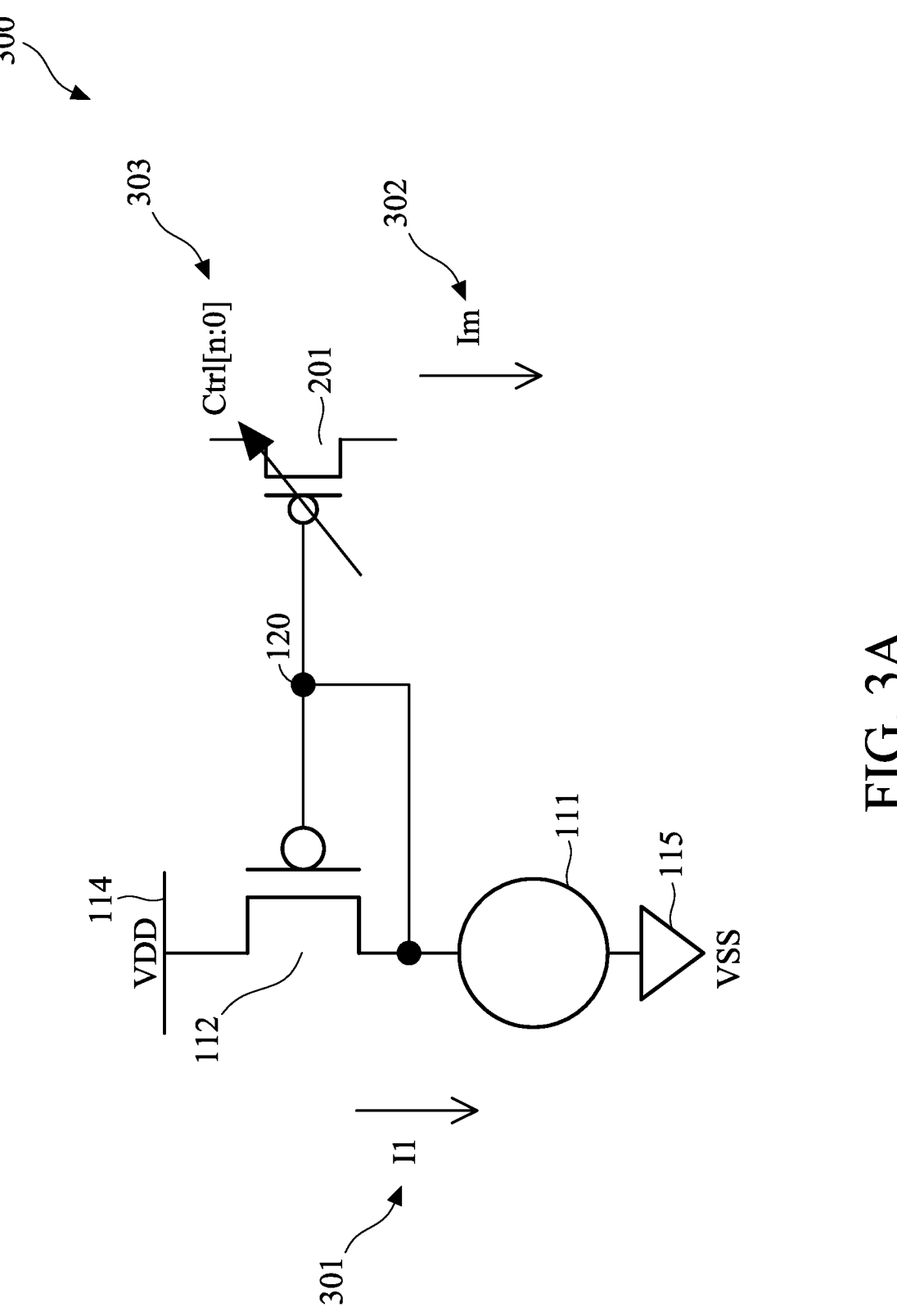
FIG. 3A depicts a first PMOS transistor and a first current DAC coupled to a PMOS controlling transistor, in accordance with some embodiments.
Figure 3B:
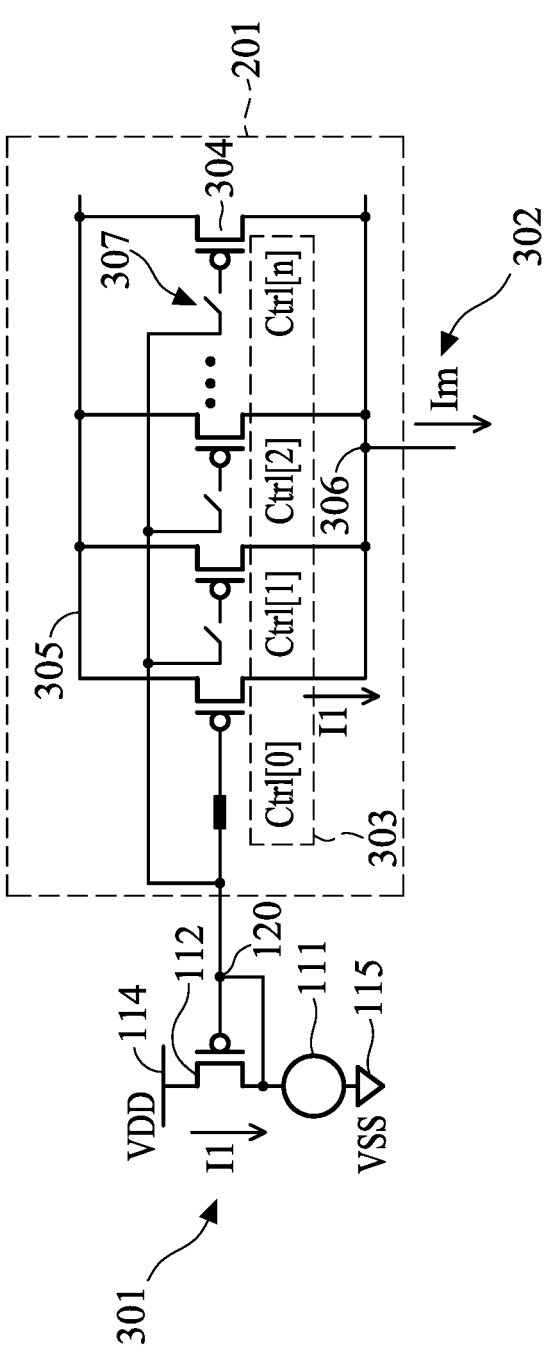
FIG. 3B shows a detailed depiction of a first PMOS transistor and a first current DAC coupled to the PMOS controlling transistor, in accordance with some embodiments.

FIG. 3A depicts a first PMOS transistor and a first current DAC coupled to a PMOS controlling transistor, in accordance with some embodiments. As shown in FIG. 3B, the PMOS controlling transistor 201 may include a plurality of PMOS controlling sub-transistors. In the example depicted in FIG. 3A, the first current DAC 111 generates a first DAC current 301. The PMOS controlling transistor 201 receives a PMOS coarse-tuning signal 303 including a plurality of PMOS coarse-tuning sub-signals Ctrl. The PMOS coarse-tuning signal 303 may be used to selectively couple the gate terminals of the PMOS controlling sub-transistors to the PMOS gate terminal node 120. Based on the first DAC current 301 and the PMOS coarse-tuning signal 303, the PMOS controlling transistor 201 generates a PMOS mirror current 302.

FIG. 3B shows a detailed depiction of a first PMOS transistor and a first current DAC coupled to the PMOS controlling transistor, in accordance with some embodiments. The detailed depiction may be a detailed version of the PMOS controlling transistor 201 of FIG. 3A. The PMOS controlling transistor 201 includes a plurality of PMOS controlling sub-transistors 304. The source terminals of each of the plurality of PMOS controlling sub-transistors 304 are connected to each other at a PMOS source terminal node 305. Furthermore, the drain terminals of each of the plurality of PMOS controlling sub-transistors 304 are connected to each other at a PMOS drain terminal node 306. A gate terminal of the first PMOS transistor 112 is coupled to a PMOS gate terminal node 120. A gate terminal of each of the plurality of PMOS controlling sub-transistors 304 is coupled to a PMOS gate switch 307, which is coupled to the PMOS gate terminal node 120. The PMOS gate switch 307 coupled to each PMOS controlling sub-transistor 304 can connect and disconnect the gate terminal of the respective PMOS controlling sub-transistor 304 to the PMOS gate terminal node 120.

Each PMOS controlling transistor 201 in the example delay line 200 of FIG. 2 may be represented by PMOS controlling transistor 201 and its constituent PMOS controlling sub-transistors 304 depicted in FIG. 3B. Furthermore, each NMOS controlling transistor 202 depicted in FIG. 2 may include a plurality of NMOS controlling sub-transistors. The gate terminal of each NMOS controlling sub-transistor may be connected to a switch that is connected to the NMOS gate terminal node 121. Each switch connected to the gate terminals of the NMOS controlling transistors 202 may be controlled by an NMOS coarse-tuning signal. The NMOS controlling transistors 202 and their constituent NMOS controlling sub-transistors may be operated analogously to the PMOS controlling transistors 201 and the PMOS controlling sub-transistors 304.

Individually controlling each of the plurality of inverters can allow the duty cycle of the example high-speed delay line 200 to be controlled. For example, inverters 108 that result in a delay line signal having a slope at a rising edge that is too great may be controlled to decrease the slope at the rising edge of the delay line. Furthermore, inverters 108 that result in a delay line signal having a slope at a falling edge that is too low may be controlled to increase the slope at the falling edge of the delay line. This control can modify the time at which the delay line signal is at logic high ("1"), and thus control the duty cycle of the delay line signal. The first current DAC 111 and the second current DAC 116 can thus work in conjunction with the PMOS coarse-tuning signals 303 and the NMOS coarse-tuning signals, respectively, to modify both the delay time and the duty cycle of the delay line input signal 106.

Figure 4:
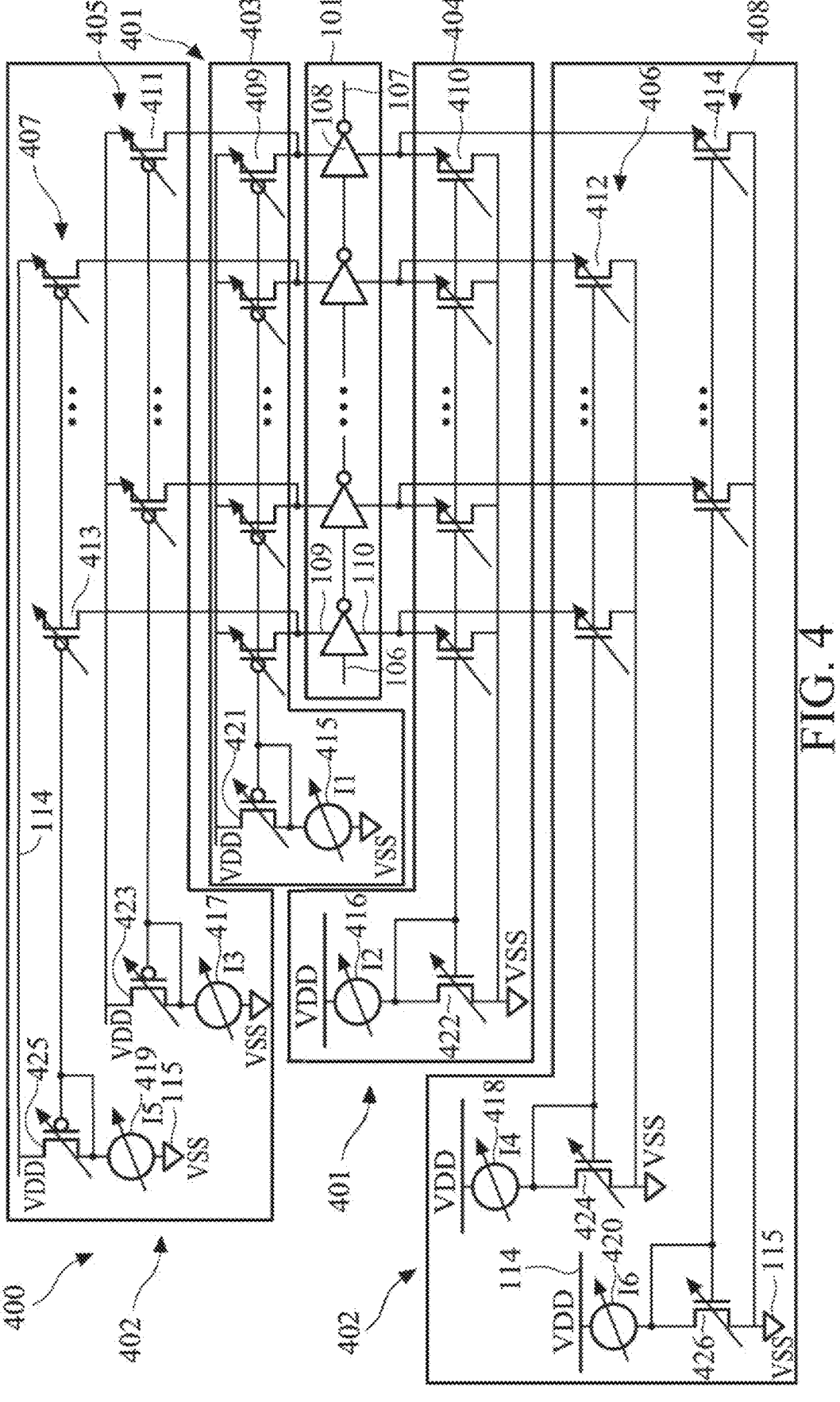
FIG. 4 depicts a duty cycle and delay-controlled high-speed delay line circuit, in accordance with some embodiments.

FIG. 4 depicts a duty cycle and delay-controlled high-speed delay line circuit, in accordance with some embodiments. In the example depicted in FIG. 4, the example high-speed delay line 400 includes a delay line core 101 including a plurality of inverters 108 connected to each other in series. The high-speed delay line circuit 400 further includes a delay control circuit 401 coupled to the delay line core 101 and a duty cycle control circuit 402 coupled to the delay line core. As shown in FIG. 4, the delay control circuit 401 includes a first current mirror circuit 403 and a second current mirror circuit 404. The first current mirror circuit 403 includes a current DAC 415, a first PMOS delay transistor 421 and a plurality of PMOS delay controlling transistors 409. Each of the plurality of PMOS delay controlling transistors 409 are coupled to the first controlling node 109 of a separate inverter 108 within the delay line core 101. The second current mirror circuit 404 includes a current DAC 416, a first NMOS delay transistor 422 and a plurality of NMOS delay controlling transistors 410. Each of the plurality of NMOS delay controlling transistors 410 are coupled to the second controlling node 110 of a separate inverter 108 within the delay line core 101.

As shown in FIG. 4, the duty cycle control circuit 402 includes a third current mirror circuit 405, a fourth current mirror circuit 406, a fifth current mirror circuit 407, and a sixth current mirror circuit 408. The third current mirror circuit 405 includes a current DAC 417, a first PMOS duty cycle transistor 423 and a plurality of first PMOS duty cycle controlling transistors 411. Each of the plurality of first PMOS duty cycle controlling transistors 411 is coupled to the first controlling node 109 of a separate inverter 108 within the delay line core 101. As shown in FIG. 4, the plurality of first PMOS duty cycle controlling transistors 411 are coupled to the first controlling nodes 109 of alternate (e.g., every other) inverters 108. Thus, each inverter 108 having a first controlling node 109 coupled to a first PMOS duty cycle controlling transistor 411 may be adjacent to one or two inverters 108 having a first controlling node 109 that is not coupled to a first PMOS duty cycle controlling transistor 411.

The fourth current mirror circuit 406 includes a current DAC 418, a first NMOS duty cycle transistor 424 and a plurality of first NMOS duty cycle controlling transistors 412. Each of the plurality of first NMOS duty cycle controlling transistors 412 is coupled to the second controlling node 110 of a separate inverter 108 within the delay line core 101. As shown in FIG. 4, the plurality of first NMOS duty cycle controlling transistors 412 are coupled to the second controlling nodes 110 of alternate inverters 108. Each of the plurality of first NMOS duty cycle controlling transistors 412 is coupled to the second controlling node 110 of an inverter 108 that is not coupled to one of the first PMOS duty cycle controlling transistors 411 at the first controlling node 109.

The fifth current mirror circuit 407 includes a current DAC 419, a second PMOS duty cycle transistor 425 and a plurality of second PMOS duty cycle controlling transistors 413. Each of the plurality of second PMOS duty cycle controlling transistors 413 is coupled to the first controlling node 109 of a separate inverter 108 within the delay line core 101. In the example shown in FIG. 4, each of the second PMOS duty cycle controlling transistors 413 are coupled to the inverters 108 adjacent to the inverters 108 to which the first PMOS duty cycle controlling transistors 411 are coupled. Thus, the second PMOS duty cycle controlling transistors 413 are coupled to the first controlling node 109 of the inverters 108 that are coupled to the first NMOS duty cycle controlling transistors 412 at the second controlling node 110.

The sixth current mirror circuit 408 includes a current DAC 420, a second NMOS duty cycle transistor 426 and a plurality of second NMOS duty cycle controlling transistors 414. Each of the plurality of second NMOS duty cycle controlling transistors 414 is coupled to the second controlling node 110 of a separate inverter 108 within the delay line core 101. As shown in FIG. 4, each of the plurality of second NMOS duty cycle controlling transistors 414 are coupled to the inverters 108 adjacent to the inverters 108 to which the first NMOS duty cycle controlling transistors 412 are coupled. Thus, the second NMOS duty cycle controlling transistors 414 are coupled to the second controlling node 110 of the inverters 108 that are coupled to the second PMOS duty cycle controlling transistors 413 at the first controlling node 109.

During operation of the example duty cycle and delay-controlled high-speed delay line circuit 400, the delay of the delay line core 101 may be coarse-tuned by the delay control circuit 401. For example, the first current mirror circuit 403 and the second current mirror circuit 404 can be used to coarse-tune the delay of each of the plurality of inverters 108 within the delay line core 101. The specific operation of the delay control circuit 401 may be substantially similar to the high-speed delay line 200 with individually controlled inverters illustrated in FIG. 2. In some example embodiments, the delay control circuit 401 may coarse-tune the delay of the delay line core 101 prior to a duty cycle control of the delay line core 101.

The duty cycle control circuit 402 can be used to control the duty cycle of the delay line core 101. For example, the third current mirror circuit 405 can be used to control the delay time of alternate (e.g., even) inverters 108 at their first controlling nodes 109. The fifth current mirror circuit 407 can be used to control the delay time of other alternate (e.g., odd) inverters at their first controlling nodes 109. The fourth current mirror circuit 406 can be used to control the delay time of the other alternate (e.g., odd) inverters at their second controlling nodes 110. The sixth current mirror circuit 408 can be used to control the delay time of the alternate (e.g., even) inverters at their second controlling nodes 110.

Figure 5:
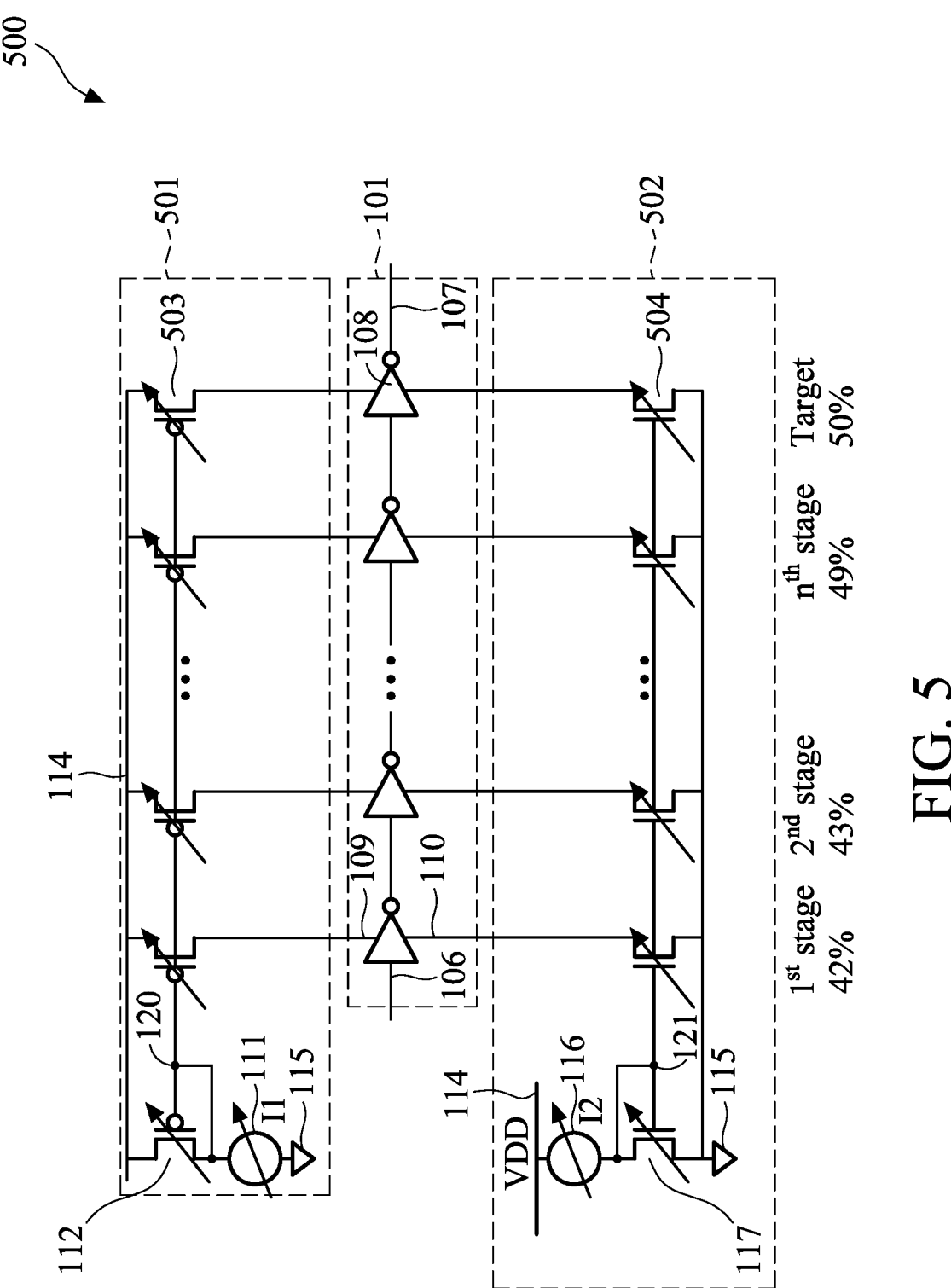
FIG. 5 depicts a duty-cycle controlled high-speed delay line circuit, in accordance with some embodiments.

FIG. 5 depicts a duty-cycle controlled high-speed delay line circuit, in accordance with some embodiments. In the example depicted in FIG. 5, the duty-cycle controlled high-speed delay line circuit 500 includes a delay line core 101 having a plurality of inverters 108 connected in series with one another. Each of the plurality of inverters 108 in the delay line core 101 includes a first controlling node 109 and a second controlling node 110. The duty-cycle controlled high-speed delay line circuit 500 further includes a PMOS controlling circuit 501 and an NMOS controlling circuit 502. The PMOS controlling circuit 501 includes a first current DAC 111, a first PMOS transistor 112, and a plurality of PMOS controlling transistors 503. The NMOS controlling circuit 502 includes a second current DAC 116, a first NMOS transistor 117, and a plurality of NMOS controlling transistors 504. An operation of the duty-cycle controlled high-speed delay line circuit 500 may include first performing a coarse-tuning of the delay time of the delay line core 101. The operation of the duty-cycle controlled high-speed delay line circuit 500 may further include separately controlling alternating inverters to control a duty cycle of the delay line core 101. Furthermore, each inverter may be controlled separately to achieve a target duty cycle of the delay line core 101.

Figure 6:
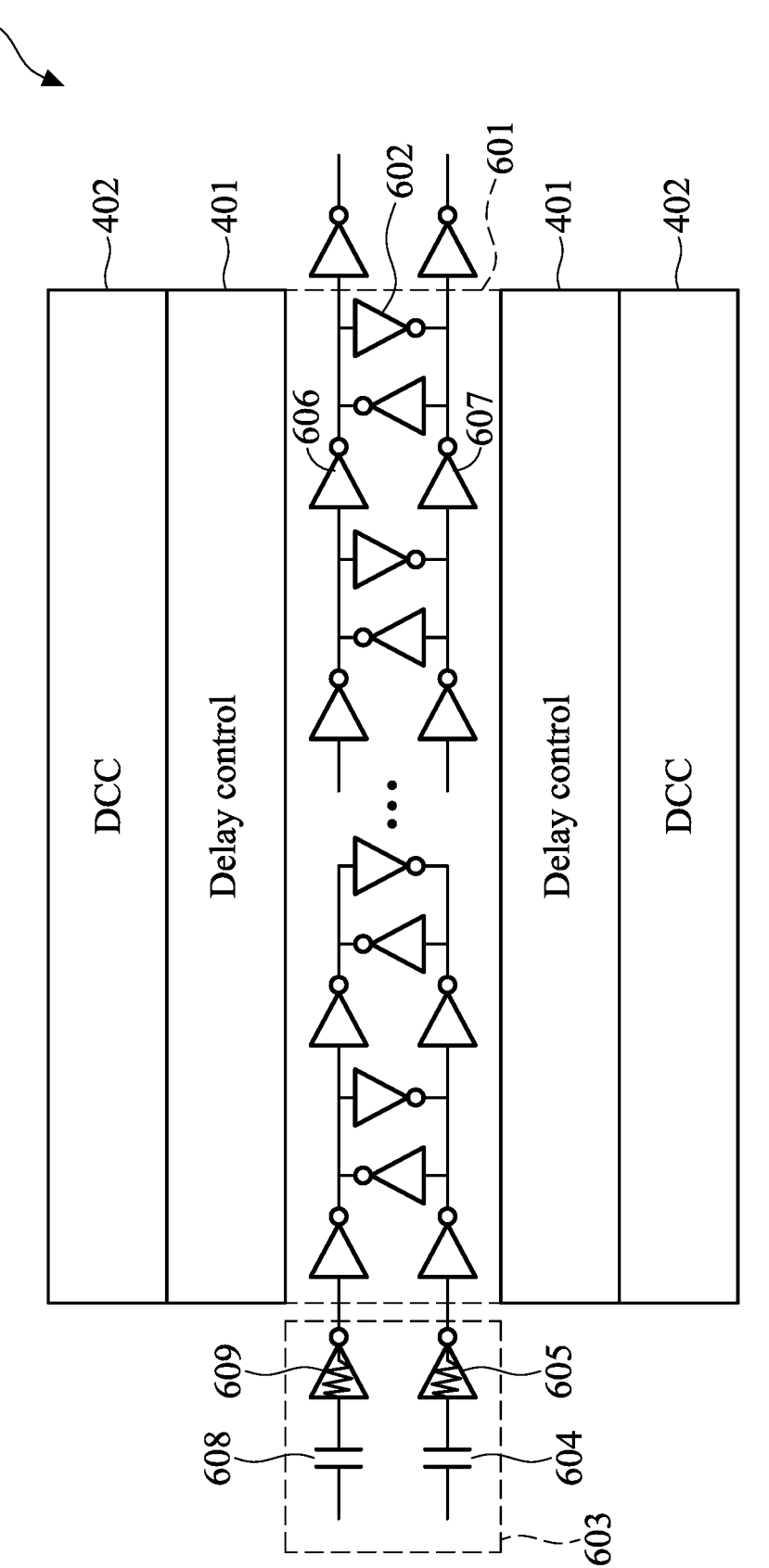
FIG. 6 depicts a high-speed delay line with a differential delay line core, in accordance with some embodiments.

FIG. 6 depicts a high-speed delay line 600 with a differential delay line core, in accordance with some embodiments. In the example depicted in FIG. 6, the example high-speed delay line 600 with a differential delay line core includes a differential delay line core 601 including a plurality of inverters (e.g., inverter 602, inverter 606, inverter 607). The example high-speed delay line 600 further includes a delay control circuit 401 coupled to the differential delay line core 601 and a duty cycle control circuit 402 coupled to the differential delay line core 601. The design and operation of the delay control circuit 401 and the duty cycle control circuit 402 may be substantially equivalent to the design and operation of the delay control circuit 401 and the duty cycle control circuit 402 depicted in FIG. 4. The high-speed delay line 600 with a differential delay line core further includes a direct current (DC) blocker circuit 603 coupled to the differential delay line core 601.

The DC blocker circuit 603 includes a first self-biasing inverter 609 coupled to an initial first inverter and a first capacitor 608 coupled to the first self-biasing inverter 609. The DC blocker circuit 603 further includes a second self-biasing inverter 605 coupled to an initial second inverter and a second capacitor 604 coupled to the second self-biasing inverter 605. The DC blocker circuit 603 can act as a high-pass filter. As understood by one of ordinary skill in the art, systems and methods disclosed herein can be used to operate the high-speed delay line 600 with a differential delay line core.

Figure 7:
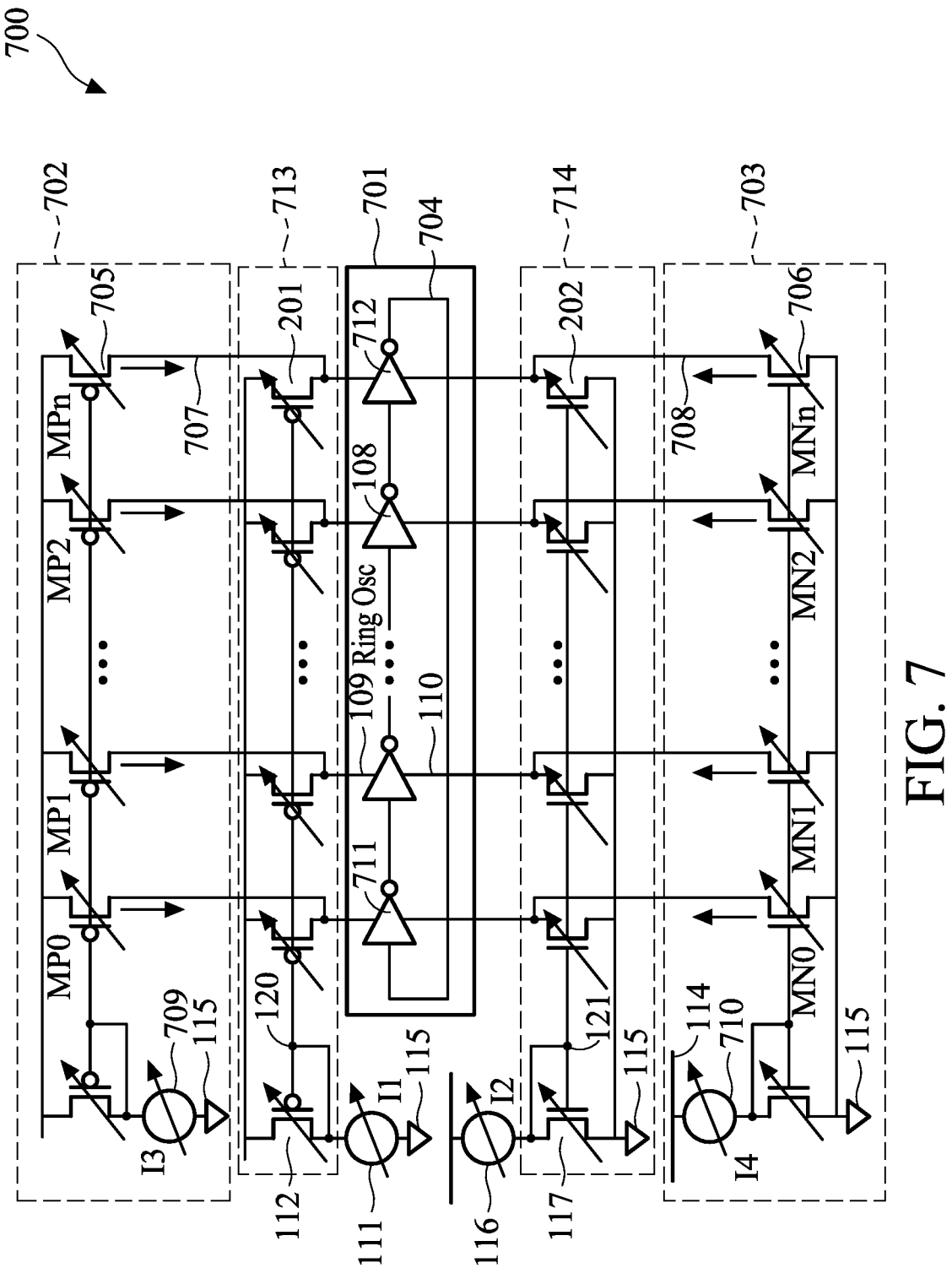
FIG. 7 depicts a high-speed delay line with a ring oscillator core, in accordance with some embodiments.

FIG. 7 depicts a high-speed delay line 700 with a ring oscillator core, in accordance with some embodiments. The ring oscillator core 701 includes a plurality of inverters 108 connected in series of which the first inverter is inverter 711 and the last inverter is inverter 712. The ring oscillator core 701 further includes a feedback path to couple the output of the inverter 712 to the input of the inverter 711. The high-speed delay line 700 with a ring oscillator core further includes a first current mirror circuit 713 comprising a plurality of first PMOS controlling transistors 201 coupled to the first controlling node 109 of separate inverters within the ring oscillator core 701. The high-speed delay line 700 with a ring oscillator core further includes a second current mirror circuit 714 comprising a plurality of first NMOS controlling transistors 202 coupled to the second controlling node 110 of separate inverters within the ring oscillator core 701. The architecture and operation of the first current mirror circuit 713 and the second current mirror circuit 714 may be substantially similar to the PMOS current mirror circuit 102 and the NMOS current mirror circuit 103 depicted in FIG. 2.

As shown in FIG. 7, the high-speed delay line 700 with a ring oscillator core further includes a third current mirror circuit 702 and a fourth current mirror circuit 703. The third current mirror circuit 702 includes a plurality of second PMOS controlling transistors 705 and a third current DAC 709. The fourth current mirror circuit 703 includes a plurality of second NMOS controlling transistors 706 and a fourth current DAC 710. Each of the second PMOS controlling transistors 705 works in conjunction with the first PMOS controlling transistor 201 to which it is coupled to control the delay of the respective inverter 108 within the ring oscillator core 701. Each of the second NMOS controlling transistors 706 works in conjunction with the first NMOS controlling transistor 202 to which it is coupled to control the delay of the respective inverter 108 within the ring oscillator core 701.

The magnitude of the current output of the third current DAC 709 may be inversely related to the magnitude of the current output of the fourth current DAC 710. Thus, the magnitude of the second PMOS mirror current 707 may be inversely related to the magnitude of the second NMOS mirror current 708. This inverse relationship between the second PMOS mirror current 707 and the second NMOS mirror current 708 can mitigate the effects of the inherent biasing present in the PMOS transistors and the NMOS transistors within the high-speed delay line 700 with a ring oscillator core shown in FIG. 7.

Figure 8:
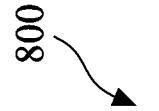
FIG. 8 depicts a high-speed delay line with a frequency-controlled ring oscillator core, in accordance with some embodiments.
Figure 8:
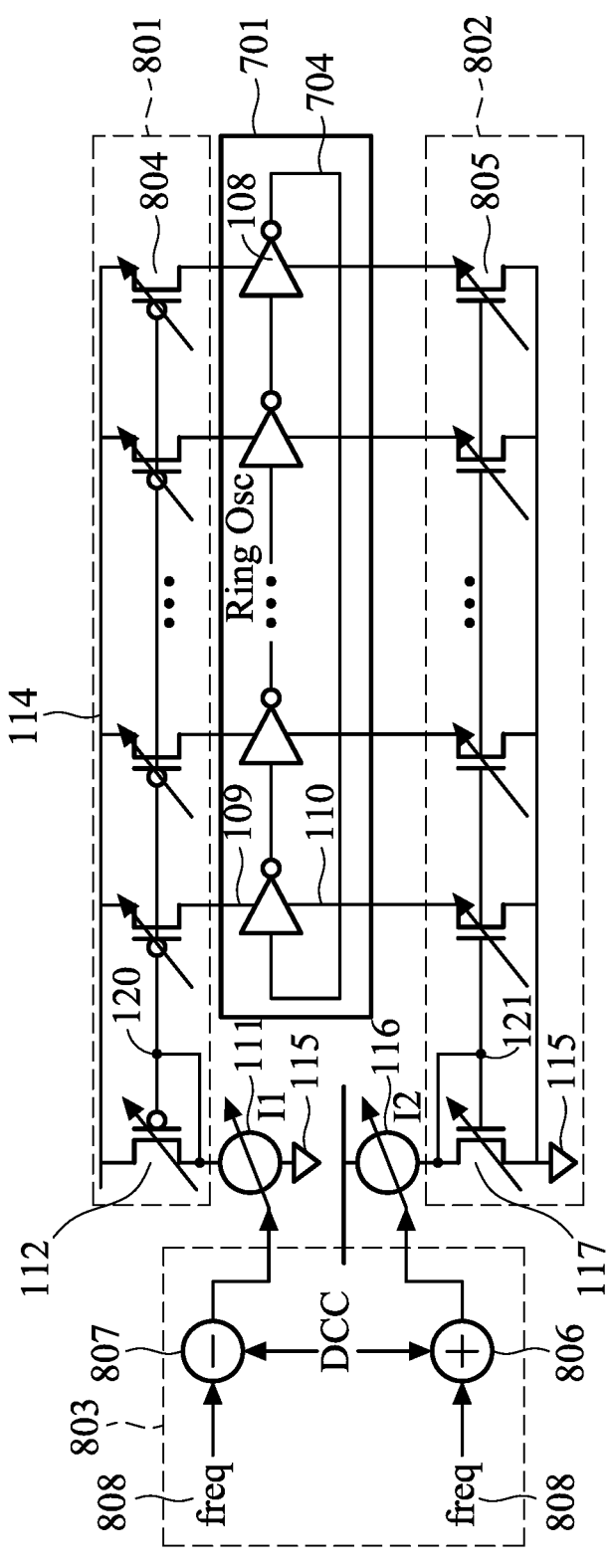

FIG. 8 depicts a high-speed delay line 800 with a frequency-controlled ring oscillator core, in accordance with some embodiments. As shown in FIG. 8, the high-speed delay line 800 with a frequency-controlled ring oscillator core [800] includes a ring oscillator core 701 having a plurality of inverters 108 connected in series. The ring oscillator core 701 may be substantially equivalent to the ring oscillator core 701 depicted in FIG. 7. The high-speed delay line 800 with a frequency-controlled ring oscillator core further includes a first current mirror circuit 801 and a second current mirror circuit 802. The configuration of the first current mirror circuit 801 may be substantially equivalent to the first current mirror circuit 713 depicted in FIG. 7. Furthermore, the configuration of the second current mirror circuit 802 may be substantially equivalent to the second current mirror circuit 714 depicted in FIG. 7.

The high-speed delay line 800 with a frequency further includes a duty cycle controlling circuit 803. The duty cycle controlling circuit 803 includes a frequency increase component 806 and a frequency decrease component 807. The frequency increase component 806 is coupled to the second current DAC 116 and is used to control a current output of the second current DAC 116. The frequency decrease component 807 is coupled to the first current DAC 111 and is used to control a current output of the first current DAC 111. A digital frequency control signal 808 is received at the frequency increase component 806 and the frequency decrease component 807. Based on the digital frequency control signal 808, the frequency decrease component 807 can adjust the current output of the first current DAC 111 and the frequency increase component 806 can adjust the current output of the second current DAC 116. The duty cycle controlling circuit 803 can thus be used to fine-tune the frequency and duty cycle of the ring oscillator core 701.

The first current mirror circuit 801 and the second current mirror circuit 802 can also be used to control the duty cycle of the ring oscillator core 701. The PMOS coarse-tuning signals and the NMOS coarse-tuning signals can be used to tune (e.g., control) the PMOS controlling transistors 804 and the NMOS controlling transistors 805 in an opposite direction. By altering the PMOS coarse-tuning signals and the NMOS coarse-tuning signals, the duty cycle of the ring oscillator core 701 can be increased or decreased.

Figure 9:
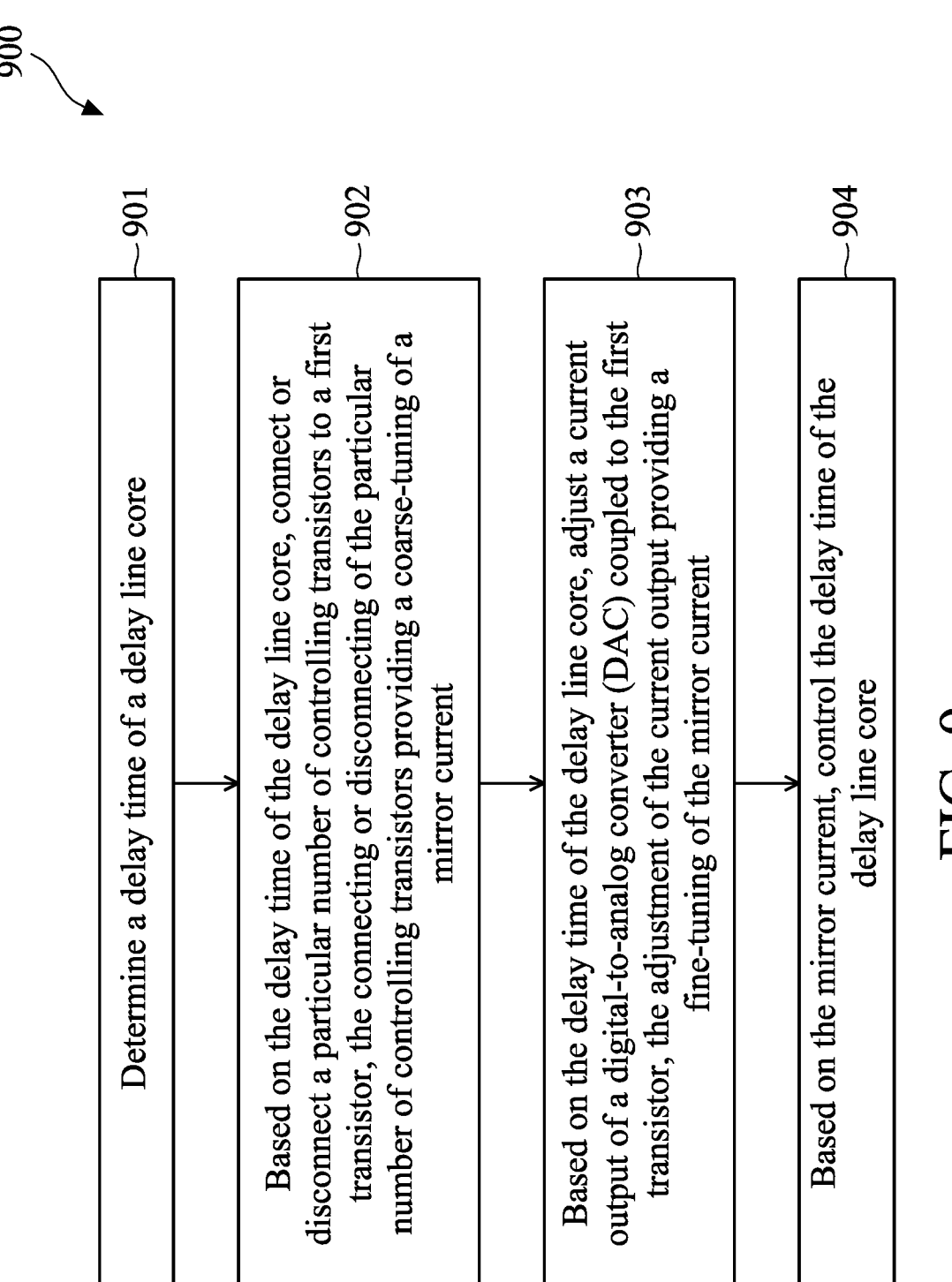
FIG. 9 depicts a method of controlling a delay line, in accordance with some embodiments.

FIG. 9 depicts a method of controlling a delay line, in accordance with some embodiments. The method 900 includes a first step 901 of determining a delay time of a delay line core. The first step 901 is shown in FIG. 1A. The delay line input signal 106 is received by the delay line core 101. The delay line output signal 107 is generated a particular time after the reception of the delay line input signal 106 based on the delay time of the delay line core 101. The method 900 further includes a second step 902 of connecting or disconnecting a particular number of controlling transistors to a first transistor based on the delay time of the delay line core, the connecting or disconnecting of the particular number of controlling transistors providing a coarse-tuning of a mirror current. The second step 902 is illustrated in FIG. 1B. A particular number of PMOS controlling transistors 113 is connected to or disconnected from the first PMOS transistor 112. This connecting and disconnecting of the PMOS controlling transistors 113 provides a coarse-tuning of the mirror current. The method 900 further includes a third step 903 of adjusting a current output of a digital-to-analog converter (DAC) coupled to the first transistor based on the delay time of the delay line core, the adjustment of the current output providing a fine-tuning of the mirror current. The third step 903 is illustrated in FIG. 1B. The current output of the first current DAC 111 is adjusted based on the delay time of the delay line core 101 to provide a fine-tuning of the mirror current at the first common node 104. The first current DAC 111 is coupled to the first PMOS transistor 112. The method 900 further includes a fourth step 904 of controlling the delay time of the delay line core based on the mirror current. The fourth step 904 is illustrated in FIG. 1B. The PMOS mirror current flows through a resistor at the first common node 104 to generate a first controlling voltage at the first controlling node 109 of each inverter 108. The mirror current thus controls the delay time of the delay line core 101.

Figure 10:
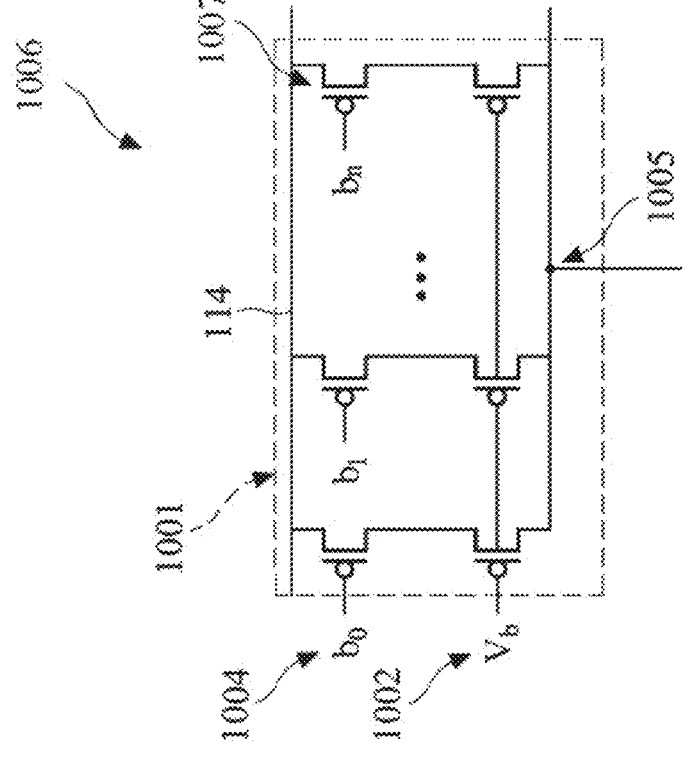
FIG. 10 depicts a shorthand notation of a controlling transistor and a detailed diagram of a controlling transistor, in accordance with some embodiments.
Figure 10:
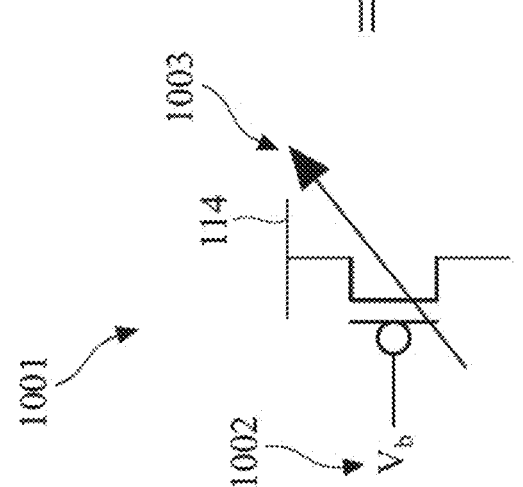

FIG. 10 depicts a shorthand notation of a controlling transistor and a detailed diagram of a controlling transistor, in accordance with some embodiments. The controlling transistor 1001 depicted in FIG. 10 may represent, for example, the PMOS controlling transistors 201 shown in FIG. 2. The arrow 1003 shown through the controlling transistor 1001 on the left in FIG. 10 may represent that the controlling transistor 1001 is shown in its abbreviated or shorthand notation. The detailed diagram of the controlling transistor 1001 may include a plurality of sub-transistors 1007. The sub-transistors 1007 may be connected to one another in series, as shown in FIG. 10. The controlling transistor 1001 may include a plurality of columns of sub-transistors 1007 connected in series, as shown in the detailed diagram of the controlling transistor 1001 in FIG. 10. Each column is coupled to the operating voltage node VDD 114 at a first end and a common node 1005 at a second end. The gates of the sub-transistors 1007 may be connected and disconnected to control the voltage and current present at the common node 1005. The common node 1005 may be, for example, the first common node 104 depicted in FIG. 1B. While the example depicted in FIG. 10 depicts a PMOS controlling transistor, similar systems and methods may be employed in NMOS controlling transistors.

Systems and methods are described herein. In one example, a delay line circuit comprises a delay line core and a first current mirror circuit. The delay line core includes a plurality of inverters connected in series. Each of the plurality of inverters is coupled to a first common node. The first current mirror circuit includes a first current source configured to generate a first digital-to-analog converter (DAC) current, a first transistor coupled to the first current source, and a plurality of first controlling transistors coupled to the first transistor and the first common node. The plurality of first controlling transistors generates a first mirror current at the first common node based on the first DAC current. A delay time of the delay line core is controlled based on the first mirror current.

In another example, a delay line circuit comprises a delay line core including a plurality of inverters connected in series. Each of the plurality of inverters has a first controlling node and a second controlling node. The delay line circuit further comprises a first current mirror circuit. The first current mirror circuit includes a first current source configured to generate a first digital-to-analog converter (DAC) current, a first transistor coupled to the first current source, and a plurality of first controlling transistors coupled to the first transistor and the first controlling node of a separate inverter within the plurality of inverters. Each of the plurality of first controlling transistors is configured to generate a first mirror current at the first controlling node of the separate inverter. The first mirror current is based on the first DAC current. A delay time of the separate inverter is based on the first mirror current.

In another example, a method of controlling a delay line comprises determining a delay time of the delay line core. The method further comprises connecting or disconnecting a particular number of controlling transistors to a first transistor based on the delay time of the delay line core. The connecting or disconnecting of the particular number of controlling transistors provides a coarse-tuning of a mirror current. The method further comprises adjusting a current output of a digital-to-analog converter (DAC) coupled to the first transistor based on the delay time of the delay line core. The adjustment of the current output provides a fine-tuning of the mirror current. The method further comprises controlling the delay time of the delay line core.

It will be appreciated by those skilled in the art that changes could be made to the embodiments described above without departing from the broad inventive concept thereof. It is understood, therefore, that the invention disclosed herein is not limited to the particular embodiments disclosed, and is intended to cover modifications within the spirit and scope of the present invention.

What is claimed is:

1. A delay line circuit comprising:
   a delay line core including a plurality of inverters connected in series, each of the plurality of inverters having a first controlling node and a second controlling node;
   a first current mirror circuit including:
   a first current source configured to generate a first digital-to-analog converter (DAC) current;
   a first transistor coupled to the first current source; and
   a plurality of first controlling transistors coupled to the first transistor and the first controlling node of a separate inverter within the plurality of inverters; and a first duty cycle control circuit coupled to alternating inverters within the delay line core and configured to control a delay time of the alternating inverters;

each of the plurality of first controlling transistors configured to generate a first mirror current at the first controlling node of the separate inverter, the first mirror current based on the first DAC current, a delay time of the separate inverter being controlled based on the first mirror current.

2. The delay line circuit of claim 1, wherein each of the first controlling transistors includes a plurality of first controlling sub-transistors.

3. The delay line circuit of claim 2, wherein each of the plurality of first controlling sub-transistors is configured to connect to and disconnect from the first transistor based on a first coarse-tuning signal.

4. The delay line circuit of claim 3, wherein connecting one of the plurality of first controlling sub-transistors to the first transistor increases the first mirror current and disconnecting one of the plurality of first controlling sub-transistors from the first transistor decreases the first mirror current.

5. The delay line circuit of claim 1, further comprising a second current mirror circuit including:

a second current source configured to generate a second digital-to-analog (DAC) current;

a second transistor coupled to the second current source; and a plurality of second controlling transistors coupled to the second transistor and the second controlling node of a separate inverter within the plurality of inverters;

each of the plurality of second controlling transistors configured to generate a second mirror current at the second controlling node of the separate inverter, the second mirror current based on the second DAC current, a delay time of the separate inverter based on the second mirror current.

6. The delay line circuit of claim 5, wherein the first duty cycle control circuit including a plurality of first duty cycle control transistors, each of the plurality of first duty cycle control transistors coupled to the first controlling node of the alternating inverters within the delay line core, the first duty cycle control transistors controlling the delay time of the alternating inverters.

7. The delay line circuit of claim 6, further comprising a second duty cycle control circuit including a plurality of second duty cycle control transistors, each of the plurality of second duty cycle control transistors coupled to the first controlling node of other alternating inverters within the delay line core, the second duty cycle control transistors controlling a delay time of the other alternating inverters, the first duty cycle control circuit and the second duty cycle control circuit controlling a duty cycle of the delay line core.

8. The delay line circuit of claim 1, wherein the first duty cycle control circuit is coupled to every other inverter of the delay line core, such that each inverter coupled to the first duty cycle control circuit is adjacent to at least one inverter whose first controlling node is not coupled to the first duty cycle control circuit.

9. A method of controlling a delay line comprising:

determining a delay time of a delay line core;

based on the delay time of the delay line core, connecting or disconnecting a particular number of controlling transistors to a first transistor, the connecting or disconnecting of the particular number of controlling transistors providing a coarse-tuning of a mirror current; and based on the delay time of the delay line core, adjusting a current output of a digital-to-analog converter (DAC) coupled to the first transistor, the adjustment of the current output providing a fine-tuning of the mirror current; and based on the mirror current, controlling the delay time and a duty cycle of the delay line core.

10. The method of claim 9, wherein the delay line core includes a plurality of inverters.

11. A delay line circuit comprising:

a delay line core including a plurality of inverters connected in series, each of the plurality of inverters having a first controlling node; and a first current mirror circuit including:

a first current source configured to generate a first digital-to-analog converter (DAC) current;

a first transistor coupled to the first current source; and a plurality of first controlling transistors coupled to the first transistor and the first controlling node of a separate inverter within the plurality of inverters; and a first duty cycle control circuit coupled to at least one of the inverters within the delay line core and configured to control a delay time of the at least one of the inverters;

each of the plurality of first controlling transistors configured to generate a first mirror current at the first controlling node of the separate inverter.

12. The delay line circuit of claim 11, wherein a delay time of the separate inverter is controlled based on the first mirror current that is responsive to the first DAC current.

13. The delay line circuit of claim 11, wherein each of the first controlling transistors includes a plurality of first controlling sub-transistors.

14. The delay line circuit of claim 13, wherein each of the plurality of first controlling sub-transistors is configured to connect to and disconnect from the first transistor based on a first coarse-tuning signal.

15. The delay line circuit of claim 14, wherein connecting one of the plurality of first controlling sub-transistors to the first transistor increases the first mirror current and disconnecting one of the plurality of first controlling sub-transistors from the first transistor decreases the first mirror current.

16. The delay line circuit of claim 14, wherein the first coarse-tuning signal includes digital code.

17. The delay line circuit of claim 11, further comprising a second current mirror circuit including:

a second current source configured to generate a second digital-to-analog (DAC) current;

a second transistor coupled to the second current source; and a plurality of second controlling transistors coupled to the second transistor and a second controlling node of the separate inverter within the plurality of inverters;

wherein each of the plurality of second controlling transistors configured to generate a second mirror current at the second controlling node of the separate inverter, the second mirror current based on the second DAC current, a delay time of the separate inverter being controlled based on the second mirror current.

18. The delay line circuit of claim 17, wherein the plurality of first controlling transistors are PMOS transistors and the plurality of second controlling transistors are NMOS transistors.

19. The delay line circuit of claim 17, wherein the first duty cycle control circuit including a plurality of first duty cycle control transistors, each of the plurality of first duty cycle control transistors coupled to the first controlling node of alternating inverters within the delay line core, the first duty cycle control transistors controlling a delay time of the alternating inverters.

20. The delay line circuit of claim 19, further comprising a second duty cycle control circuit including a plurality of second duty cycle control transistors, each of the plurality of second duty cycle control transistors coupled to the first controlling node of other alternating inverters within the delay line core, the second duty cycle control transistors controlling a delay time of the other alternating inverters, the first duty cycle control circuit and the second duty cycle control circuit controlling a duty cycle of the delay line core.

\* \* \* \* \*